US009406703B2

(12) United States Patent
Kwon et al.

(10) Patent No.: US 9,406,703 B2
(45) Date of Patent: Aug. 2, 2016

(54) FLEXIBLE DISPLAY DEVICE AND CURVED DISPLAY DEVICE

(71) Applicant: LG Display Co., Ltd., Seoul (KR)

(72) Inventors: SeYeoul Kwon, Goyang-si (KR); Sangcheon Youn, Seoul (KR); Anna Ha, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/532,590

(22) Filed: Nov. 4, 2014

(65) Prior Publication Data

US 2015/0123137 A1 May 7, 2015

(30) Foreign Application Priority Data

Nov. 6, 2013 (KR) ........................ 10-2013-0134326

(51) Int. Cl.
*H01L 27/12* (2006.01)
*H05K 1/02* (2006.01)
*H05K 1/16* (2006.01)
*H01L 29/417* (2006.01)
*H01L 29/423* (2006.01)
*H01L 29/786* (2006.01)

(52) U.S. Cl.
CPC .......... *H01L 27/124* (2013.01); *H01L 27/1225* (2013.01); *H01L 27/1244* (2013.01); *H01L 29/41733* (2013.01); *H01L 29/42384* (2013.01); *H01L 29/78603* (2013.01); *H01L 29/78696* (2013.01); *H05K 1/028* (2013.01); *H05K 1/16* (2013.01); *H05K 1/0283* (2013.01); *H05K 2201/0175* (2013.01); *H05K 2201/0179* (2013.01); *H05K 2201/0317* (2013.01); *H05K 2201/051* (2013.01); *H05K 2201/09227* (2013.01); *H05K 2201/09263* (2013.01); *H05K 2201/09272* (2013.01); *H05K 2201/09281* (2013.01); *H05K 2201/10128* (2013.01); *H05K 2201/10166* (2013.01)

(58) Field of Classification Search
CPC ............. H01L 27/124; H01L 27/1225; H01L 27/1244; H01L 29/41733; H01L 29/42384; H01L 29/78603; H01L 29/78696; H05K 1/028; H05K 1/16; H05K 1/0283; H05K 2201/0175; H05K 2201/0179; H05K 2201/0317; H05K 2201/051
USPC .......................................................... 257/72
See application file for complete search history.

(56) References Cited

U.S. PATENT DOCUMENTS

2008/0185588 A1* 8/2008 Park .................. H01L 29/78603
257/59

* cited by examiner

*Primary Examiner* — Karen Kusumakar
*Assistant Examiner* — Adam S Bowen
(74) *Attorney, Agent, or Firm* — Fenwick & West LLP

(57) ABSTRACT

Provided is a configuration for a semiconductor layer and a line for reducing the segment length of the semiconductor layer with respect to the bending direction of the flexible substrate. Such a configuration reduces the probability of cracks occurring in the semiconductor layer of the thin-film transistor, thereby improving the stability and durability of the thin-film transistor employed in a curved or a flexible display device. The configuration includes a thin-film transistor (TF) on the flexible substrate. The TFT includes the semiconductor layer extending obliquely with respect to the direction of the line.

20 Claims, 8 Drawing Sheets

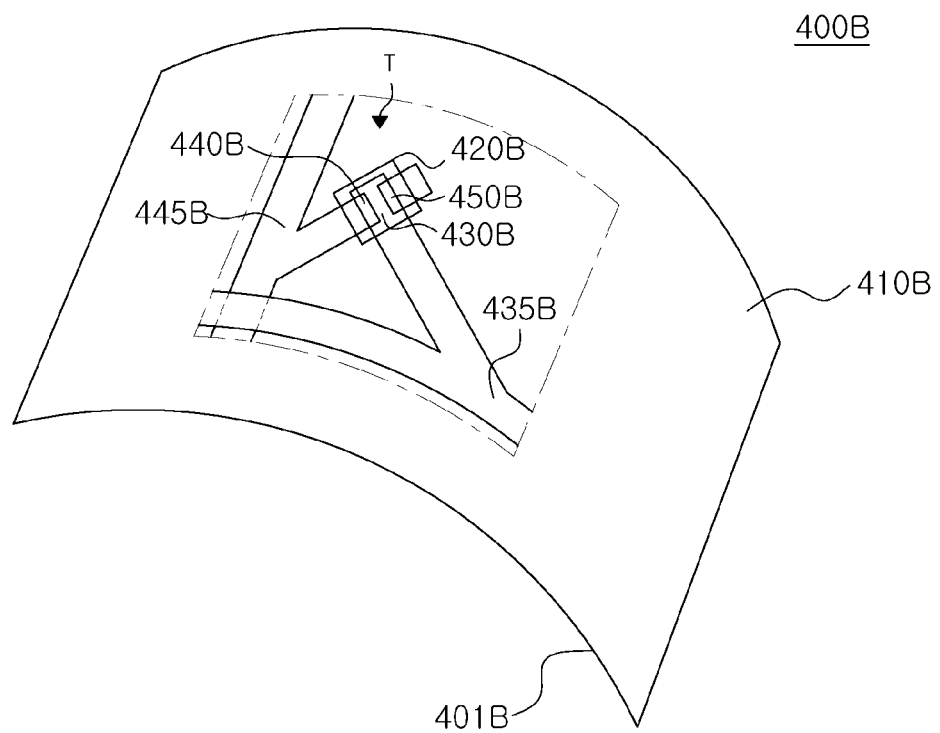

FLEXIBLE DISPLAY DEVICE AND CURVED DISPLAY DEVICE

CROSS-REFERENCE TO RELATED APPLICATIONS

This application claims the priority of Korean Patent Application No. 10-2013-0134326 filed on Nov. 6, 2013, in the Korean Intellectual Property Office, the disclosure of which is incorporated herein by reference for all purposes.

BACKGROUND OF THE INVENTION

1. Field of the Invention

The present disclosure relates to a flexible display device and a curved display device. More particularly, the present disclosure relates to a flexible display device and a curved display device with improved reliability by reducing the force imparted on elements in the display devices when the display devices are bent.

2. Description of the Related Art

Lately, flexible display devices are attracting attention as the next generation display devices. These flexible display devices are fabricated with flexible materials such as plastic so that they are able to display images when they are bent, like paper.

Applications of such flexible display devices are increasing from computer monitors and televisions to personal portable devices. Accordingly, research into flexible display devices having a larger display area with reduced volume and weight is on-going.

SUMMARY OF THE INVENTION

In a flexible display device driven in an active matrix scheme, thin-film transistors are used for driving the display device. When the flexible display device is bent, elements in the thin-film transistors receive tension or compression force in the bending direction. Due to the force by the bending, cracks may occur in the elements of the thin-film transistors. Such cracks negatively affect the reliability of the thin-film transistors and hence the flexible display device. When a flexible display device is bent in several directions, force imparted on elements of thin-film transistors can be reduced depending on the shapes and layout of the elements. Disclosed is a flexible display device that can reduce force imparted on elements in thin-film transistors even when the flexible display device is bent.

An object of the present disclosure is to provide a flexible display device that reduces force imparted on elements in a thin-film transistor when the device is bent in several directions to thereby reduce cracks occurring in the elements of the thin-film transistor.

The objects of the present disclosure are not limited to the aforementioned objects, and other objects, which are not mentioned above, will be apparent to those skilled in the art from the following description.

According to an aspect of the present disclosure, there is provided a display device. The display device includes a flexible substrate, lines, and a thin-film transistor (TFT). The line is formed on the flexible substrate. The TFT includes a semiconductor layer extending obliquely with respect to an extending direction of the line.

According to an aspect of the present disclosure, there is provided a display device. The display device includes a flexible substrate, lines, and a thin-film transistor (TFT). The line is formed on the flexible substrate. A semiconductor layer of the TFT includes a first portion and a second portion. The first portion extends in a first direction oblique to an extending direction of the line. The second portion extends in a second direction oblique to the extending direction of the line.

Such a configuration reduces cracks occurring in the semiconductor layer of the thin-film transistor, thereby improving the stability and durability of the thin-film transistor employed in a curved or a flexible display device.

The details of other embodiments are included in the detailed specification and drawings.

BRIEF DESCRIPTION OF THE DRAWINGS

The above and other aspects, features and other advantages of the present invention will be more clearly understood from the following detailed description taken in conjunction with the accompanying drawings, in which:

FIG. 4B is a schematic illustration showing an exemplary arrangement of a line, a semiconductor layer and electrodes of a thin-film transistor on a flexible substrate in a bent state according to an embodiment of the present disclosure;

DETAILED DESCRIPTION OF THE PREFERRED EMBODIMENT

Figure 1:
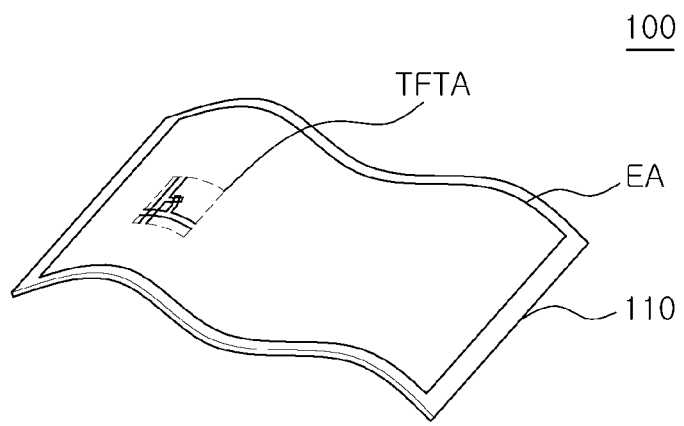
FIG. 1 is a view conceptually illustrating a flexible display device that is bendable in one or more directions according to an exemplary embodiment of the present disclosure.

Various advantages and features of the present invention and methods thereof will become apparent from the following description of embodiments with reference to the accompanying drawings. However, the present invention is not limited to exemplary embodiment disclosed herein but may be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above other elements and a case in which the corresponding elements are intervened with other layers or elements.

The same reference numerals indicate the same elements throughout the specification.

In the drawings, size and thickness of each element are arbitrarily illustrated for convenience of description, and the present invention is not necessarily limited to those illustrated in the drawings.

Although first, second, and the like are used in order to describe various components, the components are not limited by the terms. The above terms are used only to discriminate one component from the other component. Therefore, a first component mentioned below may be a second component within the technical spirit of the present invention.

The components of various embodiments of the present invention can be partially or entirely bonded to or combined with each other and can be interlocked and operated in technically various ways as can be fully understood by an ordinary person skilled in the art, and the embodiments can be carried out independently of or in association with each other.

Hereinafter, various embodiments of the present invention will be described in detail with reference to the accompanying drawings.

FIG. 1 is a view conceptually illustrating a flexible display device bendable in a several directions according to an exemplary embodiment of the present disclosure.

A flexible display device 100 refers to a display device with flexibility. Such a flexible display device 100 may also be referred to as a bendable display device, a rollable display device, an unbreakable display device, a foldable display device, a twistable display device, a stretchable display device, a wrinkable display device, a resilient display device, an elastic display device, or the like. The flexible display device also includes a curved display device. The curved display device refers to a flexible display device that is bent and fixed in a predetermined curvature.

The flexible display device 100 may include an emitting area EA. The emitting area EA is to emit light. The emitting area EA includes a plurality of pixels therein and a plurality of thin-film transistors for driving the plurality of pixels. Each of the thin-film transistors is formed in a thin-film transistor area TFTA. The emitting area EA may include a plurality of thin-film transistor areas TFTAs.

Referring to FIG. 1, the flexible display device 100 may be bent in one or more directions. When a part of the flexible display device 100 is bent, the emitting area EA and the thin-film transistor areas TFTAs may bend according to the curvature of the flexible substrate. In the embodiments described in the present disclosure, one or more electrodes and/or a semiconductor layer of the TFT are arranged to reduce the bend stress caused by bending of the flexible display device 100.

In the disclosure, the direction in which the flexible substrate is bent may be referred as the "bending direction." That is, the "bending direction" refers to the direction parallel to the tangent vector on the plane that is tangent to the bent portion of the flexible substrate. In a given bending direction, a structure on the flexible substrate aligned parallel to the bending direction will be subjected to the most tension force and compression force. It should be appreciated that multiple bending directions can be defined on a flexible substrate 110 when it has multiple bent areas as illustrated in FIG. 1.

Figure 2A:
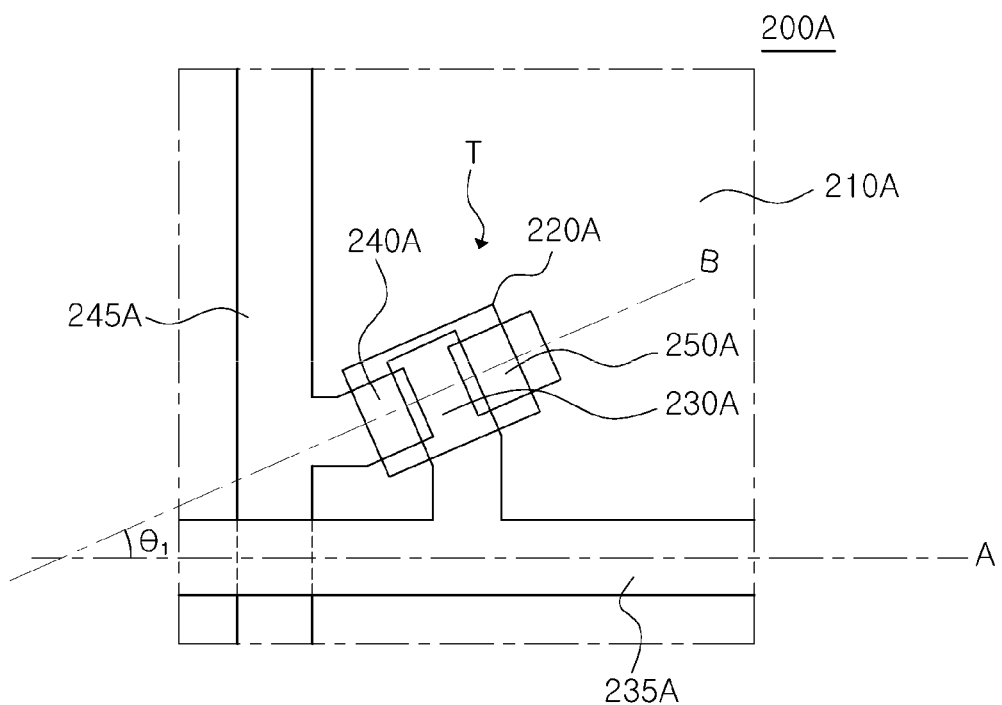
FIG. 2A is a plane view of a thin-film transistor and an exemplary layout of lines in a display device according to an embodiment of the present disclosure.

FIG. 2A is a plane view illustrating an exemplary arrangement of a thin-film transistor and lines in a flexible display device according to an exemplary embodiment of the present disclosure.

The flexible substrate 210A is an element to support various elements in the flexible display device 200A. The flexible substrate 210A may be made of a flexible insulation material. Examples of a flexible insulating material may include polyimide (PI) resin, polyetherimide (PEI) resin, polyethyelene terephthalate (PET) resin, polycarbonate (PC) resin, polymethylmethacrylate (PMMA) resin, polystyrene (PS) resin, styrene-acrylonitrile copolymer (SAN) resin, and silicon-acryl resin.

On the substrate 210A, the gate line 235A and the data line 245A are formed. The gate line 235A and the data line 245A are made of conductive materials. The gate line 235A may be formed on a layer and the data line 245A may be formed on another layer, with an insulation material therebetween. The gate line 235A and the data line 245A may be orthogonal to each other. The layout of the gate line 235A and the data line 245A is not limited to that illustrated in FIG. 2A but other layouts may be applied. The gate line 235A and the data line 245A may be connected to a power supply unit or a drive unit at edge portions of the flexible substrate 210A.

One or more thin-film transistors T are disposed on the flexible substrate 210A. The thin-film transistor T includes a semiconductor layer 220A, a gate electrode 230A, a source electrode 240A, and a drain electrode 250A. For convenience, the thin-film transistor T will be described as having a coplanar structure in which the source electrode 240A, the drain electrode 250A, and the gate electrode 230A are formed above or below the semiconductor layer 220A. However, it should be noted that the application of semiconductor layer arrangement and the electrodes arrangement described in the present disclosure is not particularly limited to the structure of the thin-film transistor T, and thus the thin-film transistor T can have various other structures.

The semiconductor layer 220A includes a channel region in which a channel is formed, and source and drain regions in contact with the source electrode 240A and the drain electrode 250A, respectively. In some embodiments, the semiconductor layer 220A may be made of amorphous silicon or polycrystalline silicon.

In some embodiments, the semiconductor layer 220A may be made of oxide semiconductor material. Examples of the oxide semiconductor material includes: quaternary metallic oxide such as indium-tin-gallium-zinc-oxide (InSnGaZnO) based material; ternary metal oxide such as indium-gallium-zinc-oxide (InGaZnO) based material, indium-tin-zinc-oxide (InSnZnO) based material, indium-aluminum-zinc-oxide (InAlZnO) based material, tin-gallium-zinc-oxide (SnGaZnO) based material, aluminum-gallium-zinc-oxide (AlGaZnO) based material, and tin-aluminum-zinc-oxide based (SnAlZnO) material; binary metal oxide such as indium-zinc-oxide (InZnO) based material, tin-zinc-oxide (SnZnO) based material, aluminum-zinc-oxide (AlZnO) based material, zinc-magnesium-oxide (ZnMgO) based material, tin-magnesium-oxide (SnMgO) based material, indium-magnesium-oxide (InMgO) based material, and indium-gallium-oxide (InGaO) based material; and mono metal oxide such as indium-oxide (InO) based material, tin-oxide (SnO) material, and zinc-oxide (ZnO) based material. The composition ratios among elements contained in the oxide semiconductor materials listed above are not limited to specific values but may have various values.

The semiconductor layer 220A for driving the thin-film transistor T is formed on the flexible substrate 210A. Thus, the semiconductor layer 220A can be subjected to the bend stress and may be damaged from the bend stress when bending the flexible substrate 210A. Accordingly, in an embodiment of the present disclosure, the semiconductor layer 220A having a rectangular shape is formed or otherwise arranged in an orientation that can reduce the strain of the semiconductor layer 220A from the bend stress. That is, the semiconductor layer 220A is extended obliquely with respect to the direction in which a gate line 235A and/or a data line 245A is extended.

In the example shown in FIG. 2A, the semiconductor layer 220A on the flexible substrate 210A extends in an oblique direction from the extending direction of the gate line 235A. More particularly, the semiconductor layer 220A has a rectangular shape with two longer sides and two shorter sides. The direction in which the gate line 235A extends is indicated by the line A. Also, the direction in which the longer sides of the semiconductor layer 220A extend is indicated by the line B in FIG. 2A.

The gate electrode 230A may be formed so that it overlaps the semiconductor layer 220A. At least a part of the gate electrode 230A overlaps the semiconductor layer 220A. The gate electrode 230A may be extended in a direction perpendicular to the direction in which the gate line 235A is extended so as to be connected to the gate line 235A.

The source electrode 240A and the drain electrode 250A may be formed so that they overlap the semiconductor layer 220A. At least parts of the source electrode 240A and the drain electrode 250A may overlap the semiconductor layer 220A. The source electrode 240A may be extended in a direction perpendicular to the direction in which the data line 245A is extended so as to be connected to the data line 245A. The drain electrode 250A may be connected to a pixel electrode in the display device.

In FIG. 2A, the bending direction of the flexible substrate is parallel to line A, that is, the extending direction of the gate line 235A. By arranging the semiconductor layer 220A to extend obliquely with respect to the gate line 235A, a segment length of the semiconductor layer 220A being aligned parallel to the bending direction can be reduced.

As used herein, the term segment length refers to the maximum unit length of a continuous portion of an element measured in the bending direction of a flexible display device. Strain on the semiconductor layer 220A from the bend stress correlates to the segment length of the semiconductor layer being parallel to the bending direction. Therefore, reduction in the segment length of the semiconductor layer 220A translates to reduction of strain on the semiconductor layer 220A, which in turn, reduces the chance of crack generation in the semiconductor layer 220A during bending of the flexible substrate. With the reduced chance of cracks in the semiconductor layer 220A, improvement in performance, stability and lifespan of the thin-film transistor T in a flexible display device or a curved display device can be achieved.

Referring to FIG. 2A, in order to shorten the segment length, the direction in which the semiconductor layer 220A is extended (denoted as line B), is angled away from the direction in which the gate line 235A is extended (denoted as line A). The angle $\theta_1$ between the direction of the semiconductor layer 220A and the gate line 235A may be an angle that larger than 0° and less than 90°. Preferably, the angle $\theta_1$ may be between 30° and 60°. For a given width of the semiconductor layer 220A, the segment length can be reduced by about 50% by arranging the semiconductor layer 220A to extend in the angle $\theta_1$ between 30° and 60°.

In the example shown in FIG. 2A, the bending direction is parallel to the direction in which the line (e.g., the gate line or the data line) is extended. However, it should be noted that the bending direction illustrated in FIG. 2 is merely an example. The bending direction of the flexible display device 200A is not limited to the direction in which the lines are extended. Rather, the flexible display device 200A may be bent various directions.

Figure 2B:
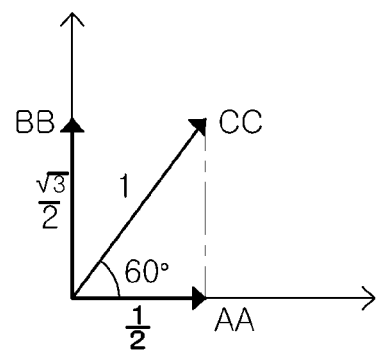
FIG. 2B is a graph illustrating the relationship between the bending direction and the mechanical stress imparted on the semiconductor layer according to an embodiment of the present disclosure.

FIG. 2B is a graph for illustrating force imparted on the semiconductor layer used in the flexible display device. The bend stress on the semiconductor layer from bending is proportional to the segment length of the semiconductor layer. The longer the segment length of the semiconductor layer, the larger the strain on the semiconductor layer in the bending direction. Further, the larger the strain on the semiconductor layer, the higher the probability of cracks in the semiconductor layer. Accordingly, the probability of crack generation in the semiconductor layer from bending of the flexible display device can be reduced by reducing the maximum value of the segment length of the semiconductor layer extending in the bending direction.

Referring to FIG. 2B, a vector AA that extends from the origin to a point AA, a vector BB that extends from the origin to a point BB, and a vector CC that extends from the origin to a point CC are illustrated in the graph. The angle made by the vector AA and the vector CC is 60°. When the direction in which the semiconductor layer 220A is extended is parallel to the vector CC and the bending direction is also parallel to the vector CC, the length of the vector CC, that is, the segment length of the semiconductor layer 220A, is 1. In contrast, when the direction in which the semiconductor layer 220A is extended is parallel to the vector CC and the bending direction is parallel to the vector AA, the length of the vector AA, that is, the segment length of the semiconductor layer 220A, is ½. As mentioned earlier, the strain on the semiconductor layer 220A from bending of the flexible display device 200A is proportional to the segment length. Accordingly, in comparison to the semiconductor layer 220A extending parallel to the bending direction, about 50% less strain in the semiconductor layer 220A can be expected when the semiconductor layer 220A is arranged to extend at about 60° with respect to the bending direction.

In some embodiments, an electrode of a thin-film transistor T may include a plurality of parts that are arranged in at least two different directions. In FIG. 2A, the source electrode 240A is connected to one end of the semiconductor layer 220A and connected to the data line 245A. A part of the source electrode 240A toward the data line 245A is extended parallel to the bending direction while a part of the source electrode 240A toward the semiconductor layer 220A is extended in an oblique direction with respect to the bending direction. The drain electrode 250A is connected to the other end of the semiconductor layer 220A and connected to a pixel electrode (not illustrated). Similar to the source electrode 240A, the drain electrode 250A may include a plurality of portions that are arranged in at least two different directions.

Also, apart of the gate electrode 230A can be bent away from the other part of the gate electrode 230A. In particular, a part of the gate electrode 230A toward the gate line 235A is arranged perpendicular with respect to the gate line 235A, whereas a part of the gate electrode 230A arranged to overlap with semiconductor layer 220A is orthogonal to the gate line 235A. The part of the gate electrode 230A overlapping with the semiconductor layer 220A may be bent away from the other part of the gate electrode 230A so that it is aligned squarely between the source electrode 240A and the drain electrode 250A.

Figure 2C:
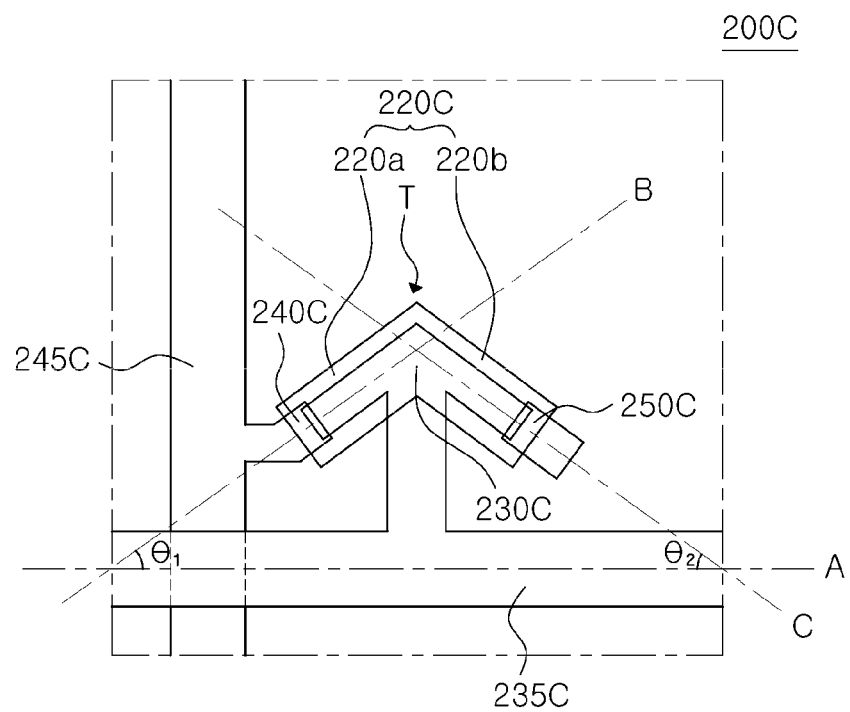
FIG. 2C is a plane view of an exemplary thin-film transistor with a semiconductor layer having a first portion and a second portion according to an embodiment of the present disclosure.

Referring now to FIG. 2C, a thin-film transistor may include a bent semiconductor layer. That is, a portion of the semiconductor layer 220C can be bent from another portion of the semiconductor layer 220C. In the example shown in FIG. 2C, the semiconductor layer 220C includes a first portion 220A and a second portion 220B. The first portion 220A is arranged to extend in a first oblique direction with respect to the extending direction of the gate line 235C. The second portion 220B of the semiconductor layer 220C is arranged to extend in a second oblique direction with respect to the extending direction of the gate line 235C. While both the first portion 220A and the second portion 220B are arranged obliquely with respect to the gate line 235C, the first portion 220A and the second portion 220B are arranged to extend in a different direction from each other.

In FIG. 2C, the line A denotes the direction in which the gate line 235C extends, the line B denotes the direction in which the first portion 220A of the semiconductor layer 220C extends, and the line C denotes the direction in which the second portion 220B of the semiconductor layer 220C extends on the flexible substrate. The angle $\theta_1$ made by line A and line B is larger than 0° and less than 90°. The angle $\theta_2$ made by line A and line C is also larger than 0° and less than 90°. It may be desirable that the angles $\theta_1$ and $\theta_2$ are between 30° and 60°. When the angles $\theta_1$ and $\theta_2$ are between 30° and 60°, the segment lengths of the first portion 220A and the second portion 220B may be shortened by 50% in average, as compared to when the semiconductor layer 220A and the direction in which the gate line 235C is extended are parallel to each other.

In some embodiments of the present disclosure, the first portion 220A and the second portion 220B of the semiconductor layer 220C may be arranged to form a right angle with respect to each other. Such a configuration may be particularly useful for a thin-film transistor T used in a flexible display device that is bendable in various directions.

The gate electrode may include a part with a shape corresponding to the shape of the semiconductor layer 220C. As shown in FIG. 2C, a part of the gate electrode 230C may extend in the perpendicular direction from the gate electrode 235C. Another part of the gate electrode 230C has a shape that corresponds to the shape of the semiconductor layer 220C, so that it is arranged to overlap with the semiconductor layer 220C to form a channel. The shape of the gate electrode 230C is not particularly limited as shown, and may have various other shapes depending on design choices.

Figure 2D:
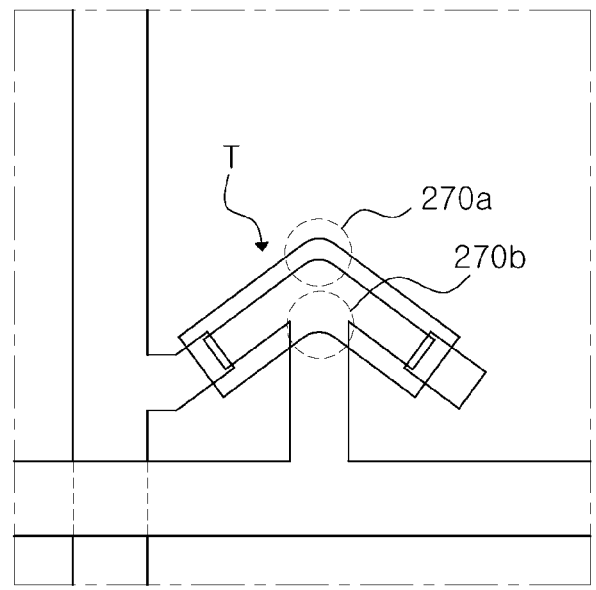
FIG. 2D is a plane view of an exemplary thin-film transistor provided with a rounded corner between a first and a second portion of a semiconductor layer according to an embodiment of the present disclosure.

FIG. 2D is a plane view of a thin-film transistor employing another exemplary bent semiconductor layer. Similar to the example shown in FIG. 2C, the semiconductor layer shown in FIG. 2D includes a first portion extending in a direction different from the direction in which a line is extended, and a second portion extending in a direction different from the direction in which the first portion is extended. In this example, however, the part of the semiconductor layer 230C between the first portion 220A and the second portion 220B is rounded. The outer rounded corner 270A and the inner rounded corner 270B provided between the first portion and the second portion of the semiconductor layer can help in distributing the bend stress which is likely to be concentrated at the bent portion of the semiconductor layer.

Figure 2E:
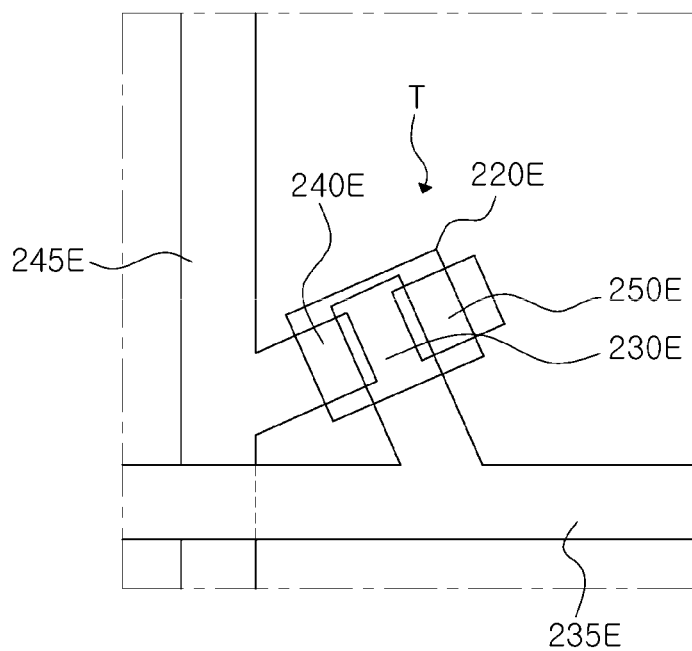
FIG. 2E is a plane view of a thin-film transistor and an exemplary layout of lines in a display device according to an embodiment of the present disclosure.

In FIG. 2E, another exemplary configuration of a thin-film transistor in a flexible display device is shown. In this example, the semiconductor layer 220E is arranged to extend in an oblique direction from the gate line 235E. In addition, the source electrode 240E, the drain electrode 250E and the gate electrode 230E are extended obliquely with respect to the direction of the gate line 235E and the data line 245E, respectively. The gate electrode 230E connected to the gate line 235E is extended parallel to the shorter sides of a rectangular shaped semiconductor layer 220E. However, the source electrode 240E is extended in the direction parallel to the longer sides of the semiconductor layer 220E so as to be connected to the data line 245E. In this configuration, the segment length of those electrodes being aligned parallel to the bending direction can be reduced, thereby helping the electrodes withstand better against the bend stress.

Figure 2F:
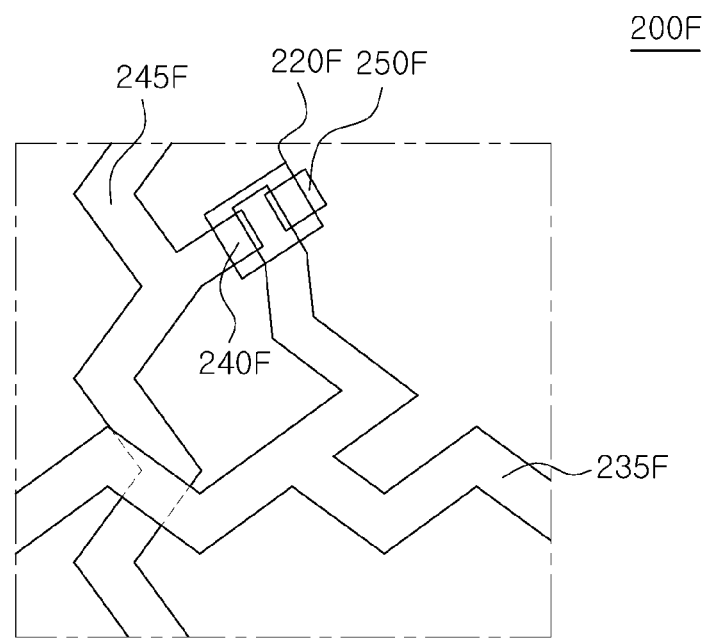
FIG. 2F is a plane view of a thin-film transistor and an exemplary layout of lines in a display device according to an embodiment of the present disclosure.

FIG. 2F illustrates yet another exemplary arrangement of a thin-film transistor and lines of a flexible display device. In the example shown in FIG. 2F, the trace of the gate line 235F and the data line 245F is in a triangular wave shape. With the gate line 235F and the data line 245F having the triangular wave trace shape, the segment length of the gate line 235F and the data line 245F measured in a several bending directions can be reduced. Accordingly, the gate line 235F and the data line 245F may withstand better against the bend stress from bending the flexible substrate in various bending directions, thereby reducing the severance of such lines in the flexible display device.

The trace line design for the gate line 235F and the data line 245F is not particularly limited to the trace line shape depicted in FIG. 2F, and may be in various other trace line shapes that can reduce the segment length of the respective line measured in one or more bending directions. For instance, the gate line 235F and/or the data line 245F may have a square wave trace shape, a sinusoidal wave trace shape or a diamond trace shape.

The width of the gate line 235F and/or the data line 245F may be increased or reduced at certain parts of the flexible display device. For instance, an increased width can be provided at one or more portions of the gate line 235F and/or the data line 245F that are likely to be subjected to higher bend stress delay or a complete disconnection by a crack at such portions of the line. The parts with increased or decreased width may be provided at a predetermined interval throughout the respective line.

Figure 3:
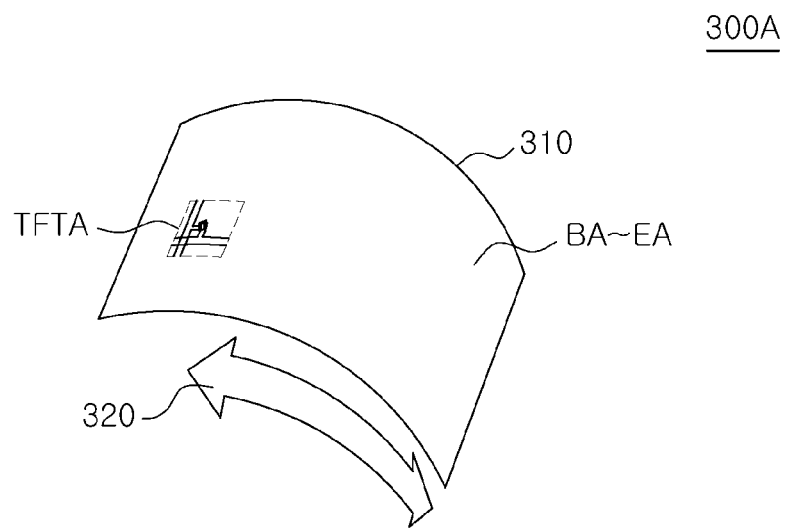
FIG. 3 illustrates a display device in a bent state.

FIG. 3 illustrates a flexible display device in a bent state. In this example, a part of the flexible display device 300 is bent downward. The bending direction 320 is the direction parallel to one of the side edges of the flexible display device 300A. Bending the flexible display device 300A forms a bending area BA. An emitting area EA may be included within the bending area BA. As such, a plurality of thin-film transistor areas TFTAs can be included in the bending area BA. As previously mentioned, the flexible display device 300A, which is bent to have a certain curvature, can be fixed to maintain its curvature and form a curved display device.

FIGS. 4A to 4D illustrate a flexible display device 400A, 400B, 400C and 400D, each having lines (e.g., gate line, data line) and thin-film transistors positioned in the bending area BA. In FIGS. 4A to 4D, substrates 410A, 410B, 410C and 410D of the flexible display devices 400A, 400B, 400C and 400D, respectively, are bent in the direction parallel to the lower sides 401A, 401B, 401C and 401D, respectively. However, the bending direction may be parallel to another side of the curved display devices 400A, 400B, 400C and 400D or to a direction that makes an angle with one side thereof. Further, although the substrates 410A, 410B, 410C and 410D are shown to have a rectangular shape, in FIGS. 4A to 4D, respectively, the flexible substrate of the flexible display devices may be in various other polygonal shapes or circular shapes.

Figure 4A:
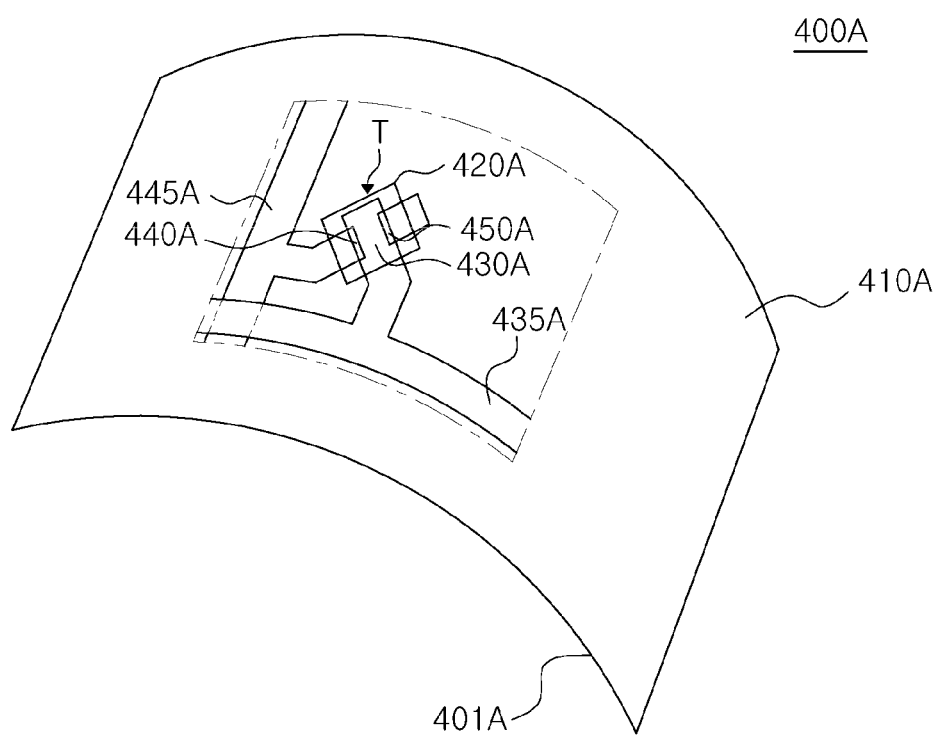
FIG. 4A is a schematic illustration showing an exemplary arrangement of a line, a semiconductor layer and electrodes of a thin-film transistor on a flexible substrate in a bent state according to an embodiment of the present disclosure.

Referring to FIG. 4A, the flexible display device 400A according to the exemplary embodiment of the present disclosure, a semiconductor layer 420A is extended obliquely with respect to the bending direction of the substrate 410A. The semiconductor layer 420A is extended obliquely with respect to the bending direction of the substrate 410A in order to reduce strain on the semiconductor layer 420A caused by the bending. Rather than arranging the semiconductor layer 420A to be parallel to the bending direction, the semiconductor layer 420A is extended obliquely with respect to the bending direction of the flexible display device 400A. In this way, reduction in the segment length of the semiconductor layer 420A aligned parallel to the bending direction can be achieved. Accordingly, the strain on the semiconductor layer 420A on the flexible substrate 410A is reduced to reduce damages.

In some embodiments, a gate electrode 430B and a source electrode 440B may extend obliquely with respect to the bending direction as shown in FIG. 4B. The gate electrode 430B and the source electrode 440B are extended in parallel to shorter sides and longer sides of a semiconductor layer 420B, respectively, so as to be connected to a gate line 435B and a data line 445B, respectively.

As the gate electrode 430B and the source electrode 440B are extended obliquely with respect to the bending direction, the segment lengths of the gate electrode 430B and the source electrode 440B are shortened. Accordingly, strain on the gate electrode 430B and the source electrode 440B by bending can be reduced.

Figure 4C:
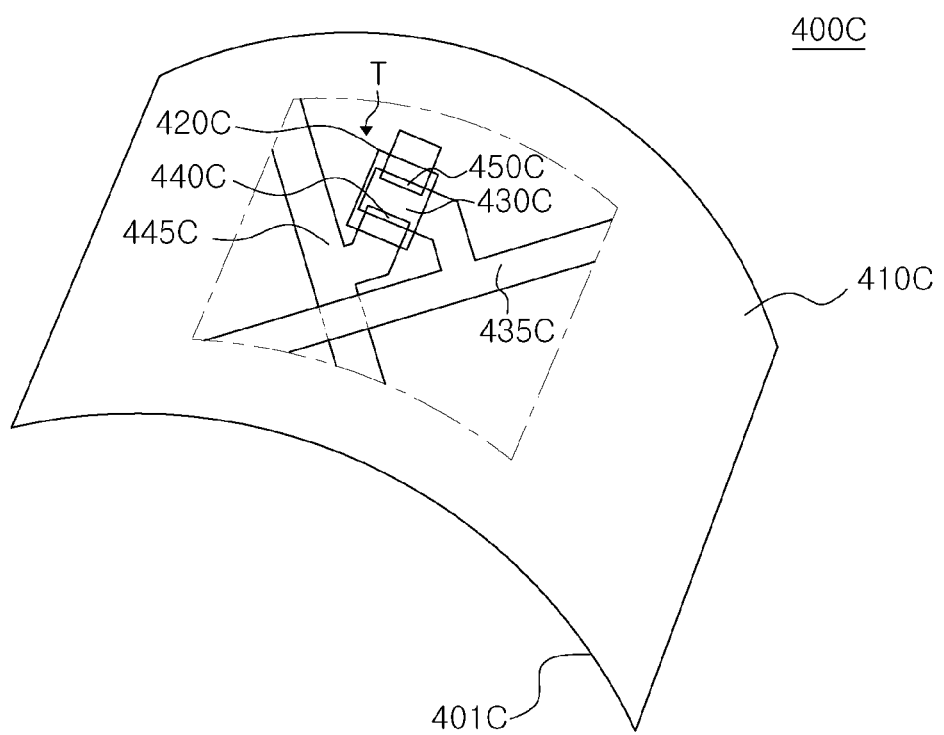
FIG. 4C is a schematic illustration showing an exemplary arrangement of a line, a semiconductor layer and electrodes of a thin-film transistor on a flexible substrate in a bent state according to an embodiment of the present disclosure.

FIG. 4C illustrates another exemplary configuration of the electrodes and semiconductor layer of the thin-film transistor T as well as the lines that are connected thereto. In this example, the lines connected to the electrodes of the thin-film transistor T are extended obliquely with respect to the bending direction of the flexible substrate 410C. In particular, the data line 445C and the gate line 435C are arranged obliquely with respect to the bending direction of the flexible substrate 410C. Accordingly, the segment length of these lines measured in the bending direction can be reduced to improve their durability against the bending stress.

Although the gate line 435C or the data line 445C are illustrated as having a linear trace shape in FIG. 4C, trace pattern of these lines may be in a triangular wave trace shape, a square wave trace shape, a sinusoidal wave trace shape, a diamond trace shape or any other trace designs capable of reducing strain from the bending. In other words, the gate line 435C and the data line 445C can have any trace line shapes as long as the trace line shape facilitates a reduction in segment length of the line aligned parallel to the bending direction.

Figure 4D:
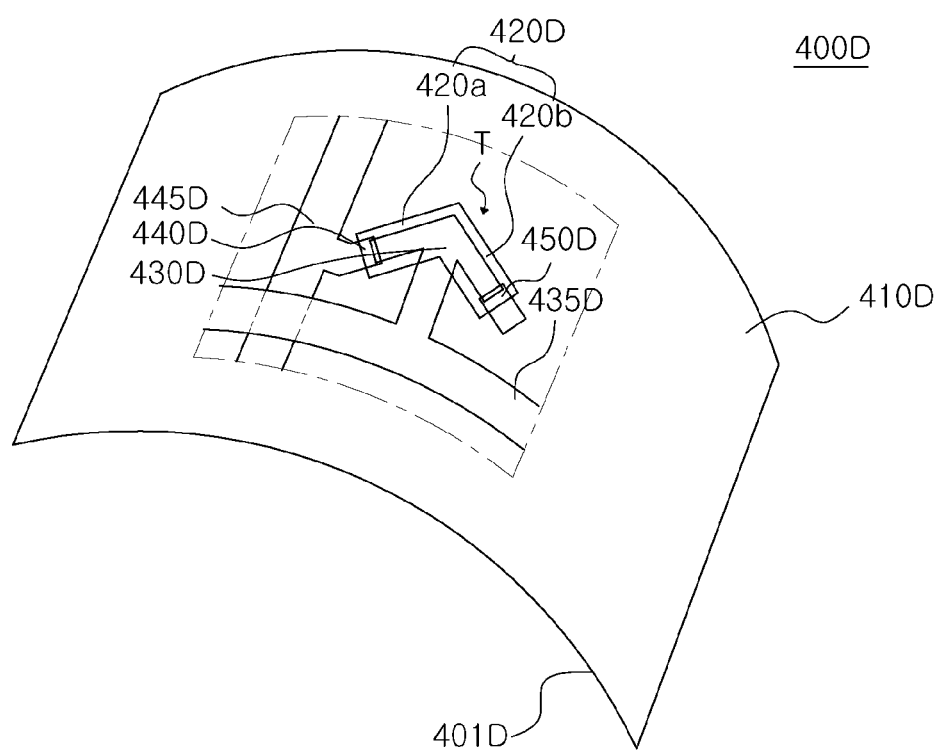
FIG. 4D is a schematic illustration showing an exemplary arrangement of a line, a semiconductor layer, and electrodes of a thin-film transistor on a flexible substrate in a bent state according to an embodiment of the present disclosure.

In some embodiments, the semiconductor layer on the flexible substrate may be in a shape, which can facilitate reduction of strain on the semiconductor layer from the bend stress. Referring to FIG. 4D, the semiconductor layer 420D may have a shape in which a part of the semiconductor layer 420D is angled away from another portion of the semiconductor layer 420D. In other words, the semiconductor layer 420D may include a first portion 420A extending obliquely with respect to the bending direction, and also include a second portion 420B extending in a direction different from the direction of the first portion 420A. The direction of the first portion 420A and the direction of the second portion 420B are both different from the bending direction of the flexible substrate 410D. When the first portion 420A and the second portion 420B are extended in directions different from the bending direction, in the curved display device 400D according to the exemplary embodiment of the present disclosure, the segment length of the semiconductor layer 420D is reduced.

According to an exemplary embodiment of the present disclosure, a flexible display device may be the one in which all of the elements are bendable in various directions.

In a flexible display device that is bendable in various directions, a semiconductor layer is formed to extend in a direction different from the direction in which a line is extended. In addition to the semiconductor layer formed to extend in a direction different from the direction in which the line is extended, in a flexible display device, a source electrode, a drain electrode, a gate electrode, a gate line, and a data line may be formed so that the segment lengths are shortened for several bending directions. When the segment lengths of elements in thin-film transistors T are shortened for several bending directions, a flexible display device can be bent in those directions. Therefore, when a flexible display device is bent in several directions, strain on all of the elements in the flexible display device by the bending can be reduced. As a result, cracks are less likely to occur in the elements in the thin-film transistor T for the bending in several directions.

Further, in a flexible display device in which all of the elements are bendable in several directions, a source electrode, a drain electrode, agate electrode, agate line and a data line may be extended in at least one direction to then be extended in a direction different from the at least one direction. In this instance, when the flexible display device is bent in several directions, the average of the segment lengths of the elements in the bending direction can be shortened.

Moreover, in a flexible display device in which all of the elements are bendable in several directions, various structures to reduce force in a bending direction are provided. In various exemplary embodiments, a semiconductor layer may include a first portion extended in a first direction different from a direction in which a line is extended, and a second portion extended in a second direction different from the first direction and different from the direction in which the line is extended.

In addition, in a flexible display device in which all of the elements are bendable in several directions, a line may have various shapes. For example, a line may have one of a triangular wave shape, a square wave shape, or a diamond shape.

In addition, in a flexible display device in which all of the elements are bendable in several directions, a source electrode or a drain electrode may be extended in a direction different from direction in which a line is extended.

Hereinafter, various characteristics of the flexible display device according to the present invention will be described.

According to another characteristic of the present invention, the semiconductor layer has a rectangular shape with its longer sides being extended in an angle between 30° and 60° with respect to the extending direction of the line.

According to still another characteristic of the present invention, the TFT includes an electrode connected to the line, the electrode extending obliquely with respect to the extending direction of the line.

According to still another characteristic of the present invention, an electrode of the TFT or the line includes a first part extending in a first direction and a second part extending in a second direction different from the first direction.

According to still another characteristic of the present invention, the line has a triangular wave trace shape, a square wave trace shape, a sinusoidal wave trace shape, or a diamond trace shape.

According to still another characteristic of the present invention, a width of the line varies periodically.

According to still another characteristic of the present invention, the flexible substrate is bendable in the direction parallel to the extending direction of the line.

According to still another characteristic of the present invention, the flexible substrate is bent in the direction parallel to the extending direction of the line and fixed in the bent state.

According to still another characteristic of the present invention, a bending direction of the flexible substrate is different from the extending direction of the line.

According to still another characteristic of the present invention, the first oblique direction and the second oblique direction make acute angles with respect to the extending direction of the line.

According to still another characteristic of the present invention, the first portion and the second portion of the semiconductor layer are arranged in a right angle with respect to each other.

According to still another characteristic of the present invention, the semiconductor layer has a rounded corner in between the first and second portions.

According to another characteristic of the present invention, an electrode of the TFT connected to the line extends obliquely with respect to the extending direction of the line.

According to still another characteristic of the present invention, an electrode of the TFT or the line includes a first part extending in a first direction and a second part extending in a second direction different from the first direction.

According to still another characteristic of the present invention, the line has a triangular wave trace shape, a square wave trace shape, a sinusoidal wave trace shape, or a diamond trace shape.

According to still another characteristic of the present invention, a width of the line varies periodically.

According to still another characteristic of the present invention, the flexible substrate is bendable in the direction parallel to the extending direction of the line.

According to still another characteristic of the present invention, the flexible substrate is bent in the direction parallel to the extending direction of the line and fixed in the bent state.

According to still another characteristic of the present invention, a bending direction of the flexible substrate is different from the extending direction of the line.

The present invention has been described in more detail with reference to the exemplary embodiments, but the present invention is not limited to the exemplary embodiments. It will be apparent to those skilled in the art that various modifications can be made without departing from the technical sprit of the invention. Accordingly, the exemplary embodiments disclosed in the present invention are used not to limit but to describe the technical spirit of the present invention, and the technical spirit of the present invention is not limited to the exemplary embodiments. Therefore, the exemplary embodiments described above are considered in all respects to be illustrative and not restrictive. The protection scope of the present invention must be interpreted by the appended claims and it should be interpreted that all technical spirits within a scope equivalent thereto are included in the appended claims of the present invention.

What is claimed is:

1. A display device, comprising:
   a flexible substrate;
   a data line or a gate line on the flexible substrate; and
   a thin-film transistor (TFT) on the flexible substrate,
   wherein the TFT includes a semiconductor layer extending obliquely with respect to a direction of the data line or gate line,
   wherein the semiconductor layer has a rectangular shape with its length extended at an angle between 30° and 60° with respect to the direction of the data line or the gate line.

2. The display device according to claim 1, wherein the TFT comprises a gate electrode, a source electrode and a drain electrode connected to the data line or the gate line, and at least one among the gate electrode, the source electrode and the drain electrode has a rectangular portion with its length extending obliquely with respect to the direction of the data line or the gate line.

3. The display device according to claim 1, wherein the TFT comprises a gate electrode, a source electrode and a drain electrode, and at least one among the gate electrode, the source electrode and the drain electrode includes a first part extending in a first direction and a second part extending in a second direction different from the first direction.

4. The display device according to claim 1, wherein the data line or the gate line has one of a triangular wave trace shape, a square wave trace shape, a sinusoidal wave trace shape, and a diamond trace shape.

5. The display device according to claim 1, wherein a width of the data line or the gate line varies periodically.

6. The display device according to claim 1, wherein the flexible substrate is bendable in a direction parallel to the direction of the data line or the gate line.

7. The display device according to claim 1, wherein the flexible substrate is bent in a direction parallel to the direction of the data line or the gate line and fixed in the bent state.

8. The display device according to claim 1, wherein a bending direction of the flexible substrate is different from the direction of the data line or the gate line.

9. The display device according to claim 1, wherein the gate line and the data line is orthogonal to each other.

10. A display device, comprising:
    a flexible substrate; and
    a data line or the gate line on the flexible substrate; and
    a thin-film transistor (TFT) on the flexible substrate,
    wherein a semiconductor layer of the TFT includes an elongated first portion and an elongated second portion, the first portion extending in a first direction oblique to a direction of the date line or the gate line and the second portion extending in a second direction oblique to the direction of the date line or the gate line,
    wherein the semiconductor layer has a rounded corner in between the first and second portions.

11. The display device according to claim 10, wherein the first direction and the second direction make an acute angle with respect to the extending direction of the date line or the gate line.

12. The display device according to claim 10, wherein the first direction and the second direction form a right angle with respect to each other.

13. The display device according to claim 10, wherein the TFT comprises a gate electrode, a source electrode and a drain electrode connected to the data line or the gate line, the gate electrode includes a part with a shape corresponding to the shape of the semiconductor layer.

14. The display device according to claim 10, wherein the TFT comprises a gate electrode, a source electrode and a drain electrode connected to the data line or the gate line, and at least one among the gate electrode, the source electrode and the drain electrode has a rectangular portion with its length extending obliquely with respect to the direction of the data line or the gate line.

15. The display device according to claim 10, wherein the TFT comprises a gate electrode, a source electrode and a drain electrode, and at least one among the gate electrode, the source electrode and the drain electrode includes a first part extending in a third direction and a second part extending in a fourth direction different from the third direction.

16. The display device according to claim 10, wherein the data line or the gate line has one of a triangular wave trace shape, a square wave trace shape, a sinusoidal wave trace shape, and a diamond trace shape.

17. The display device according to claim 10, wherein a width of the data line or the gate line varies periodically.

18. The display device according to claim 10, wherein the flexible substrate is bendable in a direction parallel to the direction of the data line or the gate line.

19. The display device according to claim 10, wherein the flexible substrate is bent in a direction parallel to the direction of the data line or the gate line and fixed in the bent state.

20. The display device according to claim 10, wherein a bending direction of the flexible substrate is different from the direction of the data line or the gate line.

\* \* \* \* \*